United States Patent

Gupta et al.

(10) Patent No.: US 7,989,949 B2
(45) Date of Patent: Aug. 2, 2011

(54) HEAT EXTRACTION FROM PACKAGED SEMICONDUCTOR CHIPS, SCALABLE WITH CHIP AREA

(75) Inventors: Vikas Gupta, Dallas, TX (US); Siva P Gurrum, Dallas, TX (US); Gregory E Howard, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 209 days.

(21) Appl. No.: 12/499,182

(22) Filed: Jul. 8, 2009

(65) Prior Publication Data

US 2009/0267218 A1   Oct. 29, 2009

Related U.S. Application Data

(62) Division of application No. 11/828,853, filed on Jul. 26, 2007, now Pat. No. 7,572,679.

(51) Int. Cl.
*H01L 23/34* (2006.01)

(52) U.S. Cl. ........ 257/720; 257/784; 257/787; 257/792; 257/793; 257/E21.502; 438/612; 438/615; 438/617; 438/106; 438/124

(58) Field of Classification Search ................ 257/720, 257/784, 787, 792, 793, E21.502; 438/612, 438/615, 617, 106, 124, 126, 127
See application file for complete search history.

(56) References Cited

U.S. PATENT DOCUMENTS

| 5,476,211 | A  | * | 12/1995 | Khandros | ........... 228/180.5 |
|-----------|----|---|---------|----------|----------------------|
| 5,989,939 | A  | * | 11/1999 | Fjelstad | ............... 438/117 |
| 6,107,682 | A  | * | 8/2000  | Fjelstad | ............... 257/693 |
| 6,215,670 | B1 | * | 4/2001  | Khandros | ............... 361/774 |
| 6,268,662 | B1 | * | 7/2001  | Test et al. | ............ 257/784 |
| 6,818,840 | B2 | * | 11/2004 | Khandros | ............... 174/267 |
| 7,032,311 | B2 | * | 4/2006  | Razon    | ................. 29/879 |
| 2008/0014678 | A1 | * | 1/2008 | Howard et al. | ......... 438/106 |

* cited by examiner

*Primary Examiner* — Matthew Smith
*Assistant Examiner* — John M Parker
(74) *Attorney, Agent, or Firm* — Yingsheng Tung; Wade J. Brady, III; Frederick J. Telecky, Jr.

(57) ABSTRACT

A semiconductor device (100A) with plastic encapsulation compound (102) and metal sheets (103a and 104) on both surfaces, acting as heat spreaders. One or more thermal conductors (103a) of preferably uniform height connect one sheet (103b) and the chip surface (101a); the number of conductors is scalable with the chip size. Each conductor consists of an elongated wire loop (preferably copper) with the wire ends attached to a pad (105), preferably both ends to the same pad. The major loop diameter is approximately normal to the first surface and the loop vertex in contact with the sheet (103b). The substrate (104, preferably a second metal sheet) covers at least portions of the second package surface and is thermally conductively connected to the chip.

18 Claims, 4 Drawing Sheets

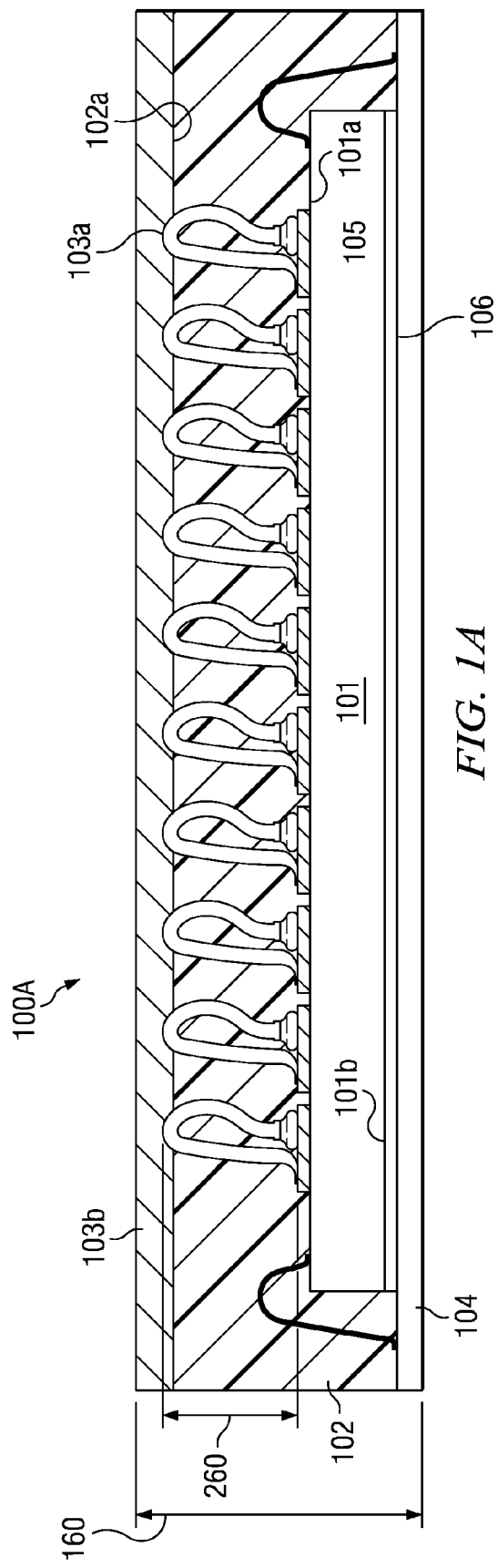
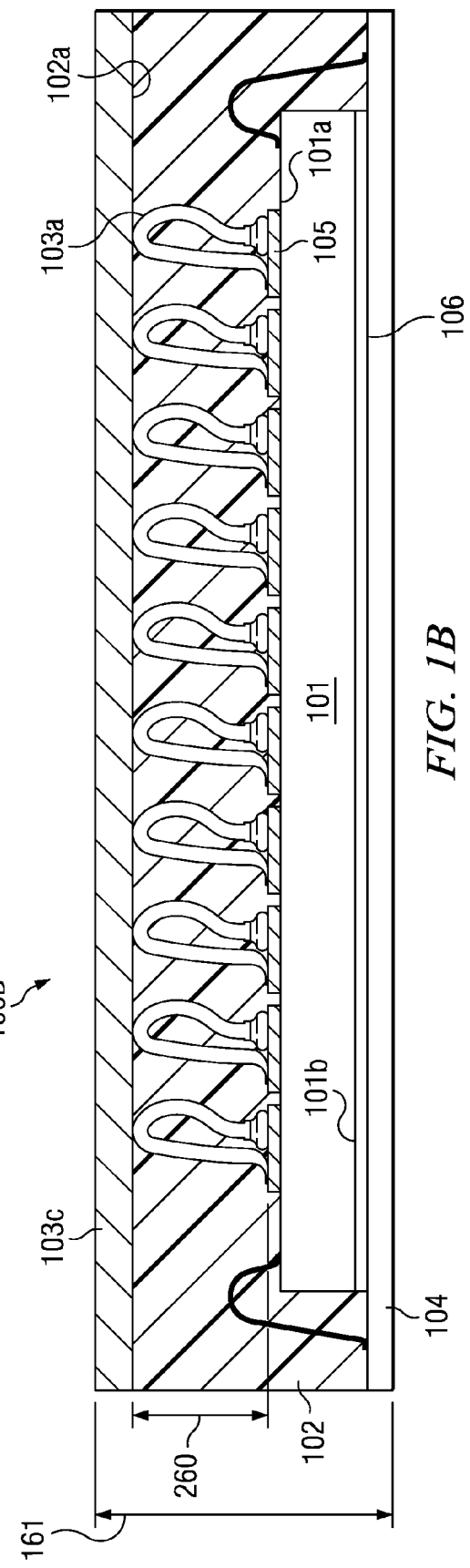

HEAT EXTRACTION FROM PACKAGED SEMICONDUCTOR CHIPS, SCALABLE WITH CHIP AREA

This application is a divisional of application Ser. No. 11/828,853 filed Jul. 26, 2007, the contents of which are herein incorporated by reference in its entirety.

FIELD OF THE INVENTION

The present invention is related in general to the field of semiconductor devices and processes and more specifically to thermally enhanced configurations of semiconductor packages offering two-way heat extraction, and to a method of fabricating these configurations using wire bonding technology.

DESCRIPTION OF THE RELATED ART

Removing the thermal heat generated by active components belongs to the most fundamental challenges in integrated circuit technology. Coupled with the ever shrinking component feature sizes and increasing density of device integration is an ever increasing device speed, density of power and thermal energy generation. In order to keep the active components at their optimum (low) operating temperatures and speed, this heat must continuously be dissipated and removed to outside heat sinks. This effort, unfortunately, becomes increasingly harder, the higher the energy density becomes.

In known technology, the most effective approach to heat removal focuses on thermal transport through the thickness of the semiconductor chip from the active surface to the passive surface. The passive surface, in turn, is attached to the chip mount pad of a metal leadframe so that the thermal energy can flow into the chip mount pad of the metallic leadframe. When properly formed, this leadframe can act as a heat spreader to an outside heat sink.

From a standpoint of thermal efficiency, however, this approach has shortcomings. The heat generated by active components must traverse the thickness of the semiconductor chip in order to exit from the chip. The heat then faces the thermal barrier of the attach material (typically a polymer) before it can enter the leadframe.

SUMMARY OF THE INVENTION

Applicants realized that for devices with attached passive chip surface a technical solution is missing to remove the heat generated by active components directly from the IC into a metallic heat conductor and a heat spreader positioned in proximity to the active components experiencing the highest temperature rise in device operation.

Specifically, applicants saw the need for an approach to lower the thermal resistance from the chip to the environment, which is scalable with the chip size; in addition, the approach needs to offer a method to remove especially the heat from thermal hot spots of the operating device.

Applicants further investigated approaches, which are equally applicable to leadframe-based packages and Ball Grid Array packages, where power dissipation and thermal characteristics are lagging, especially when multi-layer copper-laminated resin substrates have to be used for electrical performance. Applicants realized that the package structure needs to be based on fundamental physics so that design concepts are flexible enough to be applied for different semiconductor product families and a wide spectrum of design and assembly variations.

One embodiment of the invention is a semiconductor device, which has a chip with a size and a first and a second surface inside a package of plastic encapsulation compound and a third and a fourth surface. A metal sheet covers at least portions of the third surface and is preferably made of copper to operate as a heat spreader. One or more thermal conductors connect the sheet and the first surface; the more than one wire loops have a number scalable with the chip size. Each conductor consists of a wire loop (preferably copper) with both wire ends attached to a pad, the loop having a major diameter approximately normal to the first surface and the vertex in contact with the sheet. A substrate (preferably a second metal sheet) covers at least portions of the fourth surface and is thermally conductively connected to the second surface.

Another embodiment of the invention is a method for fabricating a semiconductor device with a two-way heat extraction from the chip. One surface of a semiconductor chip is thermally conductively attached to a substrate. The other chip surface has bondable pads, where one or more wire loops are formed by bonding the first end of the wire to a pad, then extending a length of wire while shaping it into a loop having a height and a vertex, and bonding the second wire end to a pad. The chip and the loops are then encapsulated. After at least partial compound polymerization, the compound on the device top surface is removed to expose the loop vertexes. A layer (or sheet) of metal is then deposited (by sputtering or plating) over the top surface, whereby the loop vertexes are contacted; the sheet can thus function as a heat spreader in device operation. The preferred metal for the sheet is copper.

Alternatively, after loop formation a mold is provided with a cavity including a lid, a bottom, and sidewalls less high than the height of the wire loops. The substrate with the attached chip is placed on the bottom of the cavity. A metal sheet is provided and placed over the chip so that it rests on the loops vertexes, elevated above the cavity sidewalls. The mold lid is placed flat on the sheet and pressed until the lid rests on the sidewalls. The cavity is then filled with molding compound, embedding the attached chip and the compressed loops. When the compound is polymerized, the position of the compressed loops is frozen and the sheet is incorporated into the surface of the finished device.

The technical advances represented by the invention, as well as the objects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1A shows a schematic cross section of a semiconductor device with an array of thermally conducting wire loops connecting the active chip surface to a heat spreader at the package surface, as fabricated by one method of the invention.

FIG. 1B shows a schematic cross section of a semiconductor device with an array of thermally conducting wire loops connecting the active chip surface to a heat spreader at the package surface as fabricated by another method of the invention.

DETAILED DESCRIPTION OF THE PREFERRED EMBODIMENTS

Figure 2:
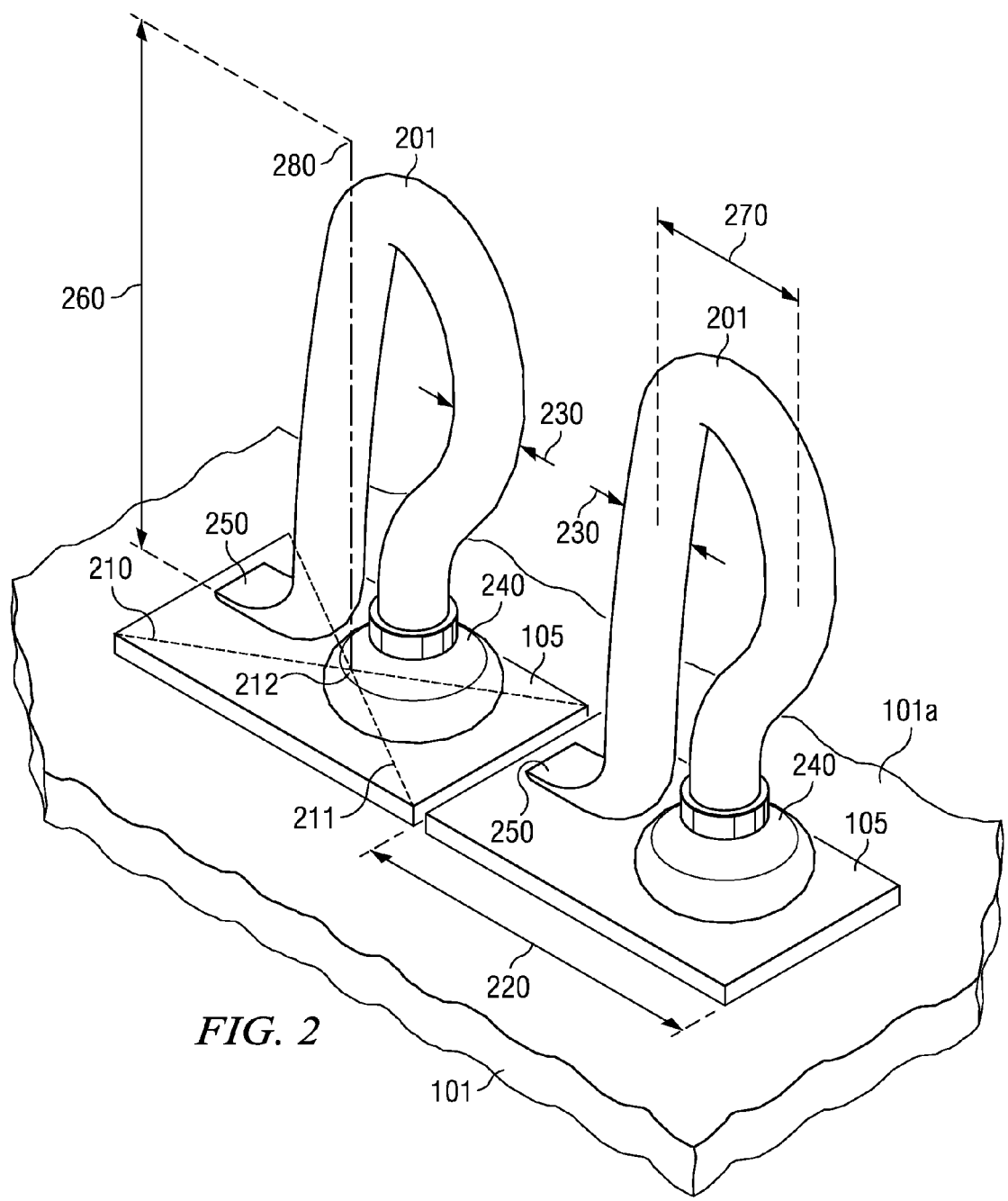
FIG. 2 is a schematic perspective view of two individual wire loops formed on a bonding pad to illustrate details of the array according to the invention.

FIGS. 1A and 1B illustrate schematically embodiments of the invention, generally designated 100A and 100B, for improving both the thermal conductance and the temperature gradient to enhance the thermal flux vertically away from the heat-generating active components on the first surface 101a of semiconductor chip 101. Devices 100A and 100B have a package 102, made of plastic encapsulation compound with a third surface 102a and a fourth surface 102b. Chip 101 is inside the package 102; consequently the thermal energy generated by operating the active components of chip 101 would increase the temperature in the neighborhood of the components rapidly, if the energy would not be transported away by the connectors 103a to the heat spreaders 103b and 103c, respectively. Connectors 103a are loops or wire preferably made of copper or gold and attached to both the active chip surface 101a and the heat spreader 103b.

In FOURIER's approach to solving the differential equation of thermal conductance, the thermal flux Q per unit of time is equal to the product of thermal conductivity λ multiplied by the gradient of temperature T, in the direction of decreasing temperature, and by the area q perpendicular to the temperature gradient:

$$dQ/dt = -\lambda \cdot (\text{grad} T) \cdot q,$$

where Q is the vector (in magnitude and direction) of thermal flux, and λ is the thermal conductivity, a materials characteristic. The thermal flux is in the direction of the temperature difference and is proportional to the magnitude of that difference.

When, over the length l, the temperature drop is steady and uniform from the high temperature T2 to the low temperature T1, then (grad T) reduces to (T2−T1)/l:

$$dQ/dt = -\lambda \cdot (q/l) \cdot (T2-T1).$$

λ·(q/l) is called the thermal conductance, and the inverse value l/(λ·q) is called thermal resistance (in analogy to OHM's law).

In the present invention, the improvement of λ·q is provided by the number, the high thermal conductivity (copper), and the geometry of conductors 103a; the improvement of (grad T) is provided by the relatively low temperature of heat spreaders 103b and 103c. Both contributions result in enhanced thermal flux vertically away from the heat-generating active components on the active first surface 101a of the semiconductor chip 101.

In addition to this enhanced thermal flux vertically away from the active chip surface, device 101 has the capability to conduct thermal energy in the opposite direction through the semiconductor material of the chip to its second (passive) surface 101b and beyond into substrate 104 (metal sheet, portion of metal leadframe, or metal-laminated insulating substrate).

The two dominant parallel faces of the cuboid configuration of semiconductor chips are referred to as "surfaces". The first surface of a semiconductor chip includes the active components, the opposite second surface is passive. The chips of semiconductor devices come in various sizes; in most devices, the chip surfaces have rectangular or square outline, in other devices, the surface are strongly elongated with a dominant linear dimension. In FIGS. 1A and 1B, the semiconductor chip is designated 101, and its first surface 101a. It is the active surface and has bondable metal pads 105. For many devices, pads 105 may be configured as a linear array or as a two-dimensional array. FIGS. 1A and 1B further show the thermal conductors 103a; they form an array, each conductor fastened on one of the pads 105. The thermal conductors 103a have uniform height so that all of them connect the first surface 101a to the heat spreader 103b, or 103c respectively, which is preferably a copper layer (103b) or copper sheet (103c). The arrangement of the thermal conductors 103a provides the freedom to scale the array with the chip size: A linear array can be scales with the chip length, and a two-dimensional array with the chip area.

FIG. 2 illustrates a portion of the first surface 101a of chip 101 with a couple of pads 105 in order to show the construction of the thermal conductors in more detail. The surface of pads 5 is preferably formed by bondable metal (such as gold, aluminum, or alloys thereof). In integrated circuit chips, surface 101a contains the active electrical components generating the heat, which needs to be dissipated. An individual bond pad or contact pad 105 may be shaped as a rectangle, a square, or a circle. A typical side length of a pad 105 is between about 40 to 150 µm, preferably between 90 and 100 µm. It is easy for most pad configurations to determine the center of the pad. As an example in FIG. 2, the crossing point of diagonals 210 and 211 determines the pad center 212.

Figure 3:
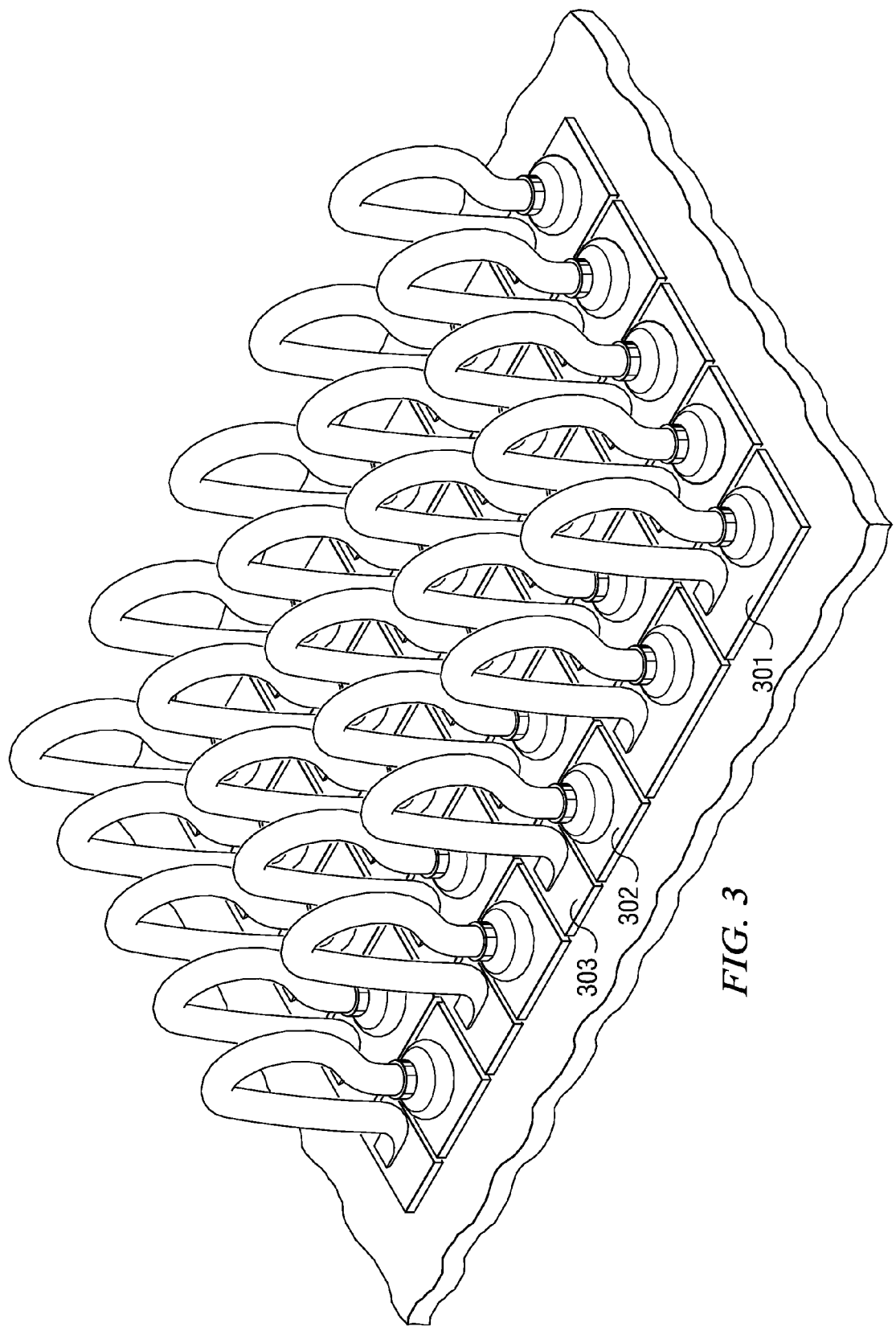
FIG. 3 is a microphotograph of a portion of a two-dimensional array of thermally conducting wire loops on the chip surface, scalable with the chip area.

When the bond pads are arrayed in orderly sequence, a pitch 220 between neighboring bond pads may be defined. For many products, the pitch is typically in the range from 50 to 200 µm, preferably between 50 and 75µ. The embodiment of FIG. 3 shows a plurality of pads arrayed in a two-dimensional pattern. An array may have the pads arranged in rows with regular pad pitch, often around the chip perimeter and frequently in parallel rows.

Alternatively, one or more pads may be positioned especially over those chip locations, where a hot spot may develop during device operation. Or the pads may have an arbitrary distribution.

Referring now to FIG. 2, attached to each pad 105 is a wire loop 201. The loops are bonded to the respective pad by a ball bonding or wedge bonding technique. The conductor consists of an elongated loop formed by a length of bonding wire 201 with each end attached to a pad. Preferably, both wire ends attached to one pad. This option is indicated in FIG. 3 by pad 301.

FIG. 3 also depicts the alternative option of separate pads for the ball bond (302) and stitch bond (303). In some devices, pads 302 and 303 may be separated by a sizable distance.

Each loop uses a bonding wire of a selected diameter 230, and has on one end a ball bond 240 and on the other end a stitch bond 250. Other embodiments may employ two wedge bonds. The bonding wire is preferably round; the wire diameter 230 is between 10 and 50 µm, and preferably about 25 µm. The preferred wire material is copper or a copper alloy because of its high thermal conductivity (4.01 W cm$^{-1}$ K$^{-1}$), approaching the best value of silver, 4.29 W cm$^{-1}$ K$^{-1}$). Alternatively, gold or a gold alloy may be used; the thermal conductivity of gold (3.17 W cm$^{-1}$ K$^{-1}$) is less than the one of copper, but the gold's bondability is better because of gold's more noble electrochemical character. Dependent on the gold wire diameter, alloys with about 1% or less beryllium, copper, palladium, iron, silver, calcium, or magnesium may allow better control of the heat-affected zone in ball formation (which would be mechanically weak for bending or other deformation stresses) and for enhancing the elasticity of the wire.

Alternatively, the bonding wire may consist of copper or a copper alloy, or of aluminum or an aluminum alloy.

A typical wire bonding process begins by positioning the semiconductor chip on a heated pedestal to raise the temperature to between 150 and 300° C. The wire is strung through a capillary. At the tip of the wire, a free air ball is created using either a flame or a spark technique. The ball has a typical diameter from about 1.2 to 1.6 wire diameters. The capillary is moved towards the chip bonding pad (105 in FIG. 2) and the ball is pressed against the metallization of the pad. For gold wires and aluminum pads, a combination of compression force and ultrasonic energy creates the formation of gold-aluminum intermetallics and thus a strong metallurgical bond. The compression (also called Z- or mash) force is typically between about 17 and 75 g; the ultrasonic time between about 10 and 20 ms; the ultrasonic power between about 20 and 50 mW. At time of bonding, the temperature usually ranges from 150 to 270° C. In the case of copper wire on copper pad, only metal interdiffusion takes place in order to generate the strong weld.

Alternatively, both wire ends can be wedge bonded to bonding pads, preferably to the same bonding pad.

Computerized wire bonders allow the formation of small yet reliable ball contacts and tightly controlled shape of the wire loop. The technical advances of the bonders further allow the selection of major and minor loop diameters, the orientation of the loop opening, the detail of the loop shape, and the reproducibility of the loops within very tight tolerances.

Finally, the capillary reaches its desired destination; for the present embodiment, this is preferably the same bonding pad from which the bonding operation originally started. The capillary is lowered to touch the pad; with the imprint of the capillary, a metallurgical stitch bond is formed, and the wire is broken off to release the capillary. Stitch contacts are small yet reliable; the lateral dimension of the stitch imprint is about 1.5 to 3 times the wire diameter (its exact shape depends on the shape of the capillary used, such as capillary wall thickness and capillary footprint). Consequently, the area of bonding pads 105 in FIG. 1 can be designed small yet so that both the ball and the stitch of the wire bond can be placed on it.

An example of the wire loop formed by the capillary under computer control is shown in FIG. 2. The loop has a major diameter, or height, 260 and a minor diameter 270. Since the loop height 260 is a major contributing factor to the thickness 160 of the final package in FIG. 1A and to the thickness 161 of the final package in FIG. 1B, the loop height is selected to minimize the package thickness while benefiting from the mechanical spring characteristic of the loop. Preferred loop heights 260 are between about 50 and 500 µm, while package thicknesses 160 reach from about 250 to 1000 µm. The height can be controlled to within ±2 to 4 µm, as long as the bonder is capable of doing this. The same limiting tolerance applies to the height of all loops in an array of wire loops, as shown in FIG. 3. Any minor height difference after loop formation is equalized by the molding process (see below), which pressures sheet 103b against the loop vertex. As a consequence of this control, the array thermally connects the first surface 101a of the chip to the thermal spreader sheet 103b.

For a fabrication method involving transfer molding (see below), it is desirable to configure the loops so that they can acts as mechanical springs. Experience has shown that in order to provide good thermal conduction as well as mechanical spring characteristics of the loops, a preferred ratio between wire diameter 230 and loop diameter 260 is approximately 4 to 10; the wire diameter is selected accordingly. More preferably, the ratio is between 6 and 10, and still more preferably between 6 and 8. Narrow loops with a shape more elongated than a circle are preferred, with the minor loop diameter 270 preferably in the range of 2 to 4 wire diameters 230.

Using automated bonders, the bond pad pitch 220 can be maintained at a fine pitch, since the major loop diameter 260 can be controlled without pitch change. Also, the ratio between major and minor diameters can be modified in order to achieve fine pitch of the bonding pads.

The preferred orientation of the major diameter is substantially perpendicular (normal) to the surface 101a of the chip. Automated bonders can keep any offset of the loop apex 280 versus the bonding pad center 212 (connected by dash-dotted line in FIG. 2) constant in direction as well as magnitude from loop to loop, enabling contact of all loops with the sheet or layer 103b of the package. In FIG. 2, this offset is zero. Alternatively, the loops of FIGS. 2 and 3 are operable as mechanical springs between sheet 103b and chip 101, a feature supporting one of the encapsulation processes in the mold (see below) and ensuring contact of all loops with the sheet.

Referring now to FIGS. 1A and 1B, in order to provide two-way heat extraction form the chip to the environment, it is preferred to use a thermally conductive adhesive body 106 to connect the second chip surface 101b to the substrate 104. The substrate may be a leadframe, or a portion of a leadframe, or a metal-laminated insulator. The thermally conductive body may be a thermally conductive adhesive attach material, as shown in FIGS. 1A and 1B for a wire-bonded chip, which has the active components on the first chip surface 101a. Alternatively, it may be metal bumps for a flip-attached chip, which has the active components on the second chip surface 101b.

Another embodiment of the invention is a method for fabricating a semiconductor device 100A (FIG. 1A) with two-way heat extraction from the packaged chip, whereby the extraction is scalable with the chip area. A semiconductor chip 101 with a first surface 101a and a second surface 101b is provided; surface 101a includes one or more bondable metal pads, which may be arranged in a one- or two-dimensional array, and a second surface. Second chip surface 101b is attached to a substrate 106 (preferably a metal sheet such as portion of a leadframe). The attachment may be accomplished by a thermally conductive adhesive material such as silver-filled epoxy. Alternatively, and especially for substrates made of metal-laminated insulators with contact pads, the attachment may be accomplished by metal bumps.

Next, a metal wire with a diameter (preferred diameter between about 25 and 50 µm, preferred metal copper, alternative metal gold) is provided and a two-dimensional array of elongated loops is formed by the technique discussed above: Bonding the first end of the wire to one of the pads, respectively; extending a length of wire while shaping it into a loop 201; and bonding the second wire end to the same pad, respectively. It is preferred to control the loop vertexes in order to maintain uniformity of the loop height 260. In addition, it is preferred to control the orientation of the loops in order to maintain normality of the major loop diameter to the first surface 101a. For some devices it is preferred to control the loop height to be between about 4 to 10 times the diameter of the wire. In this fashion, an array of loops is formed over chip surface 101a.

In the next step of the preferred process, the chip and the array of wire loops are encapsulated in compound, whereby the full height of the loops is embedded and the top surface of the device is created. There are several method for the encapsulation step. From the standpoint of process control, the preferred methods include transfer molding, cavity direct injection molding, and liquid compression molding; some aspects are described in more detail below. The compound is then allowed to polymerize, at least partially.

Next, the top surface of the compound is removed, preferably by a reactive ion etch technique, to expose the loop vertexes. Alternative removal techniques include chemical processing, or grinding, or sandblasting. These techniques expose the vertexes or other wire portions of the loops. Then, a layer or sheet of metal is deposited over the top surface, whereby the loop vertexes or wires are contacted. In this fashion, the layer or sheet can operate as a heat spreader in device operation. The preferred metal for the sheet is copper; other suitable options include gold, aluminum, or corrosion-resistant metals or alloys. As deposition method, a technique such as sputtering or plating is preferred.

In an alternative fabrication method for semiconductor device 100B (FIG. 1B), a mold is provided after the array of wire loops has been formed; the mold includes a cavity and a lid, whereby the cavity has a bottom and sidewalls of a height equal or less than the height of the wire loops. The substrate 106 and the attached chip 101 are placed on the bottom of the cavity. The metal sheet 103b is placed over the first chip surface 101a so that it rests on the array of wire loops, whereby the sheet becomes somewhat elevated above the cavity sidewalls, when the sidewalls are less high than the loops. Then, the mold lid is placed flat on the sheet 103b; thereafter, it is pressured so that it compresses the loops until the lid rests on the mold sidewalls. By this process step, thermal contact between all loops and lid 103b is assured.

Next, the mold cavity is filled with molding compound, thereby embedding the attached chip and the compressed loops. The compound is then allowed to polymerize at least partially, thereby freezing the position of the compressed loops and incorporating the heat-spreading metal sheet into the surface of the finished device.

In alternative processes, the cavity of a direct injection mold or of a liquid compression mold may be employed.

The final device offers heat-dissipating metal sheets on top and bottom device surface, available for attachment to external heat sinks, cooling fins, or other cooling options. Since the heat-transporting wire loops inside the package can be placed especially in spots known to be semiconductor hot spots during device operation, the thermal transport and cooling mechanism of the invention is especially effective.

Figure 4:
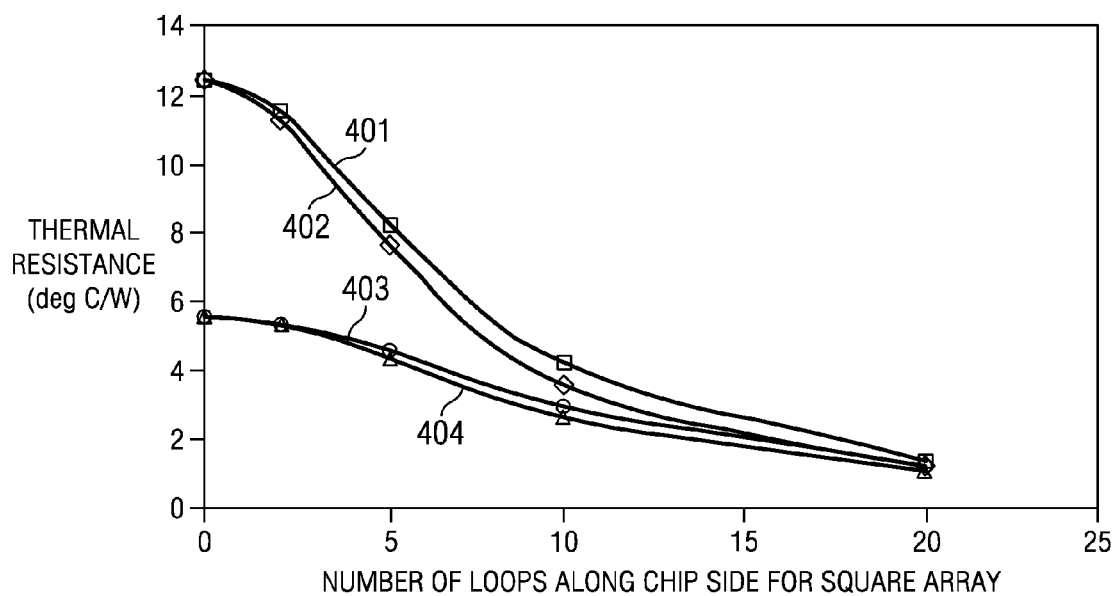
FIG. 4 is a plot of the thermal resistance of square-shaped chips as a function of the number of loops along the chip side for square arrays of loops, when the loop wire has 25 µm diameter.
Figure 5:
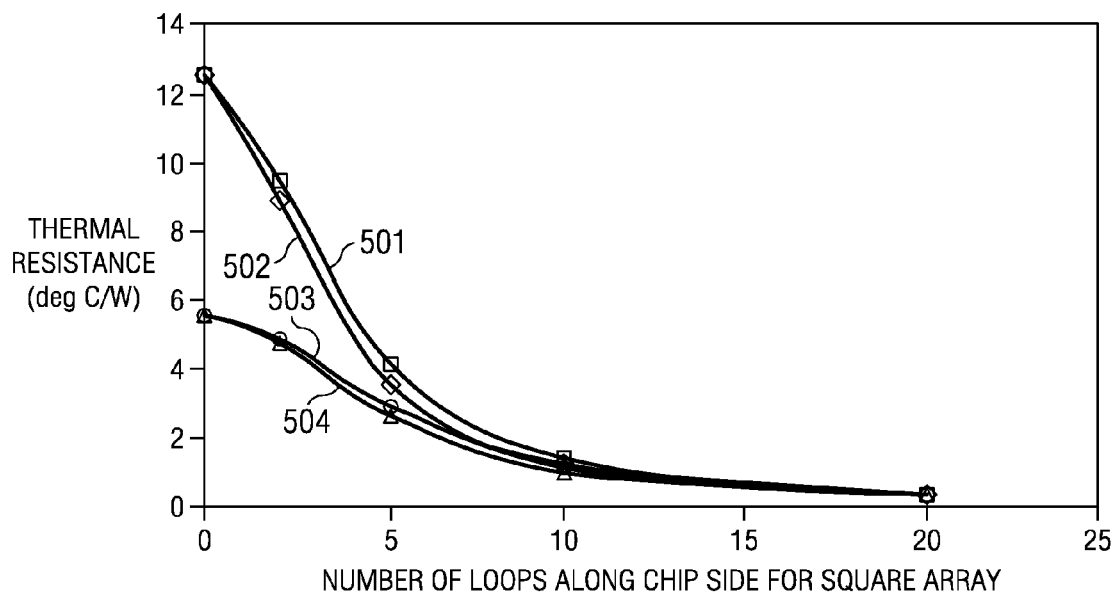
FIG. 5 is a plot of the thermal resistance of square-shaped chips as a function of the number of loops along the chip side for square arrays of loops, when the loop wire has 50 µm diameter.

FIGS. 4 and 5 show data illustrating the drop of the thermal resistance (measured in ° C./W) as a function of the number of wire loops along a chip side for square-shaped arrays of loops. The data of FIG. 4 are obtained from devices with wires of 25 μm diameter, the data of FIG. 5 with wires of 50 μm diameter. In FIG. 4, curve 401 refers to gold wires on 4 mm square chips, curve 402 to copper wires on 4 mm square chips, curve 403 to gold wires on 6 mm square chips, and curve 404 to copper wires on 6 mm square chips.

It is striking how much the thermal resistance is reduced, when 10×10 wire loops are employed as compared to no wire loops; even 5×5 loops are already very helpful. The reduction is particularly pronounced in 4×4 mm chips.

Similarly, in FIG. 5, curve 501 refers to gold wires on 4 mm square chips, curve 502 to copper wires on 4 mm square chips, curve 503 to gold wires on 6 mm square chips, and curve 504 to copper wires on 6 mm square chips. It is striking how much the thermal resistance is reduced, when 10×10 wire loops are employed as compared to no wire loops; most of the resistance reduction is already gained, when 5×5 loops are employed. The reduction is particularly pronounced in 4×4 mm chips.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A semiconductor device comprising:
   a semiconductor chip having a size, a first surface including one or more bondable metal pads, and a second surface;
   a package of plastic encapsulation compound having a third and a fourth surface, the chip inside the package;
   a metal sheet covering at least portions of the third surface; and one or more thermal conductors connecting the first surface to the sheet, each conductor being a wire loop having both wire ends attached to a pad, the loop having a major diameter approximately normal to the first surface and the vertex in contact with the sheet.

2. The device according to claim 1 wherein the more than one wire loops have a number scalable with the chip size.

3. The device according to claim 1 wherein the bondable metal pads are arrayed in one dimension.

4. The device according to claim 1 wherein the bondable metal pads are arrayed in two dimensions.

5. The device according to claim 1 wherein the thermal conductors have uniform height.

6. The device according to claim 1 wherein both wire ends of each loop are attached to one pad.

7. The device according to claim 1 wherein the wire loop is operable as a mechanical spring between the sheet and the chip.

8. The device according to claim 1 wherein the wire further has a diameter selected so that the ratio of wire diameter to major loop diameter is approximately 4 to 10.

9. The device according to claim 1 wherein the sheet includes copper.

10. The device according to claim 1 further including a substrate covering at least portions of the fourth package surface.

11. The device according to claim 10 wherein the substrate comprises a leadframe.

12. The device according to claim 10 wherein the substrate comprises a metal-laminated insulator.

13. The device according to claim 10 further including at least one thermally conductive body connecting the second surface to the substrate.

14. The device according to claim 13 wherein the body includes thermally conductive adhesive material.

15. The device according to claim 13 wherein the body includes at least one metal bump.

16. The device according to claim 1 wherein the first surface includes active semiconductor components.

17. The device according to claim 16 wherein at least one conductor is placed on a location of the first surface, which develops high temperature during device operation.

18. The device according to claim 1 wherein the second surface includes active semiconductor components.

* * * * *